United States Patent
Huang et al.

(10) Patent No.: US 6,177,362 B1
(45) Date of Patent: Jan. 23, 2001

(54) FABRICATION METHOD FOR GATE STRUCTURE HAVING GATE DIELECTRIC LAYERS OF DIFFERENT THICKNESS

(75) Inventors: Chih-Jen Huang, Hsinchu; Shih-Fang Hong, Kaohsiung, both of (TW)

(73) Assignees: United Microelectronics Corp.; United Semiconductor Corp., both of Hsinchu (TW)

( * ) Notice: Under 35 U.S.C. 154(b), the term of this patent shall be extended for 0 days.

(21) Appl. No.: 09/375,877

(22) Filed: Aug. 17, 1999

(51) Int. Cl.⁷ .................................................. H01L 21/469
(52) U.S. Cl. ........................ 438/787; 438/787; 438/788; 257/315; 257/295
(58) Field of Search ...................... 438/232, 201, 438/258, 264, 275, 257, 263, 265, 266, 593, 594, 279, 286, 250, 393, 211, 261, 591, 787, 788, 773, 981, 267, 216, 119, 199, 259, 260, 262; 257/319, 298, 315, 323, 295, 324, 326, 314, 316

(56) References Cited

U.S. PATENT DOCUMENTS 5,861,347 * 1/1999 Maiti et al. ........................... 438/787
5,888,869 * 3/1999 Cho et al. ............................. 438/258

* cited by examiner

Primary Examiner—David Nelms
Assistant Examiner—David Vu
(74) Attorney, Agent, or Firm—Thomas, Kayden, Horstemeyer & Risley

(57) ABSTRACT

A method for fabricating a gate structure which has gate dielectric layers of different thicknesses. Since the conducting layer and the protective layer are formed respectively on the dielectric layer after the formation the dielectric layer, the dielectric layer and the photoresist involved in the photolithographic etching are effectively isolated from each other. Also, the dielectric layer is formed by performing oxidation once, so the dielectric layer formed as such has different compositions from that of the dielectric layer formed by double oxidation. Thus, the contamination of the dielectric layer by the photoresist is greatly reduced while the quality and reliability of the dielectric layer are greatly improved.

13 Claims, 7 Drawing Sheets

FABRICATION METHOD FOR GATE STRUCTURE HAVING GATE DIELECTRIC LAYERS OF DIFFERENT THICKNESS

BACKGROUND OF THE INVENTION

1. Field of Invention

The present invention relates to a method for fabricating an integrated circuit (IC). More particularly, the present invention relates to a fabrication method for a gate structure having gate dielectric layers of different thicknesses.

2. Description of Related Art

Commonly on the same chip, it is necessary to equip some circuits with a low voltage (LV) device and a high voltage (HV) device. For example, an erasable programmable read only memory (EPROM) has a HV transistor for programming and a LV logic device which requires the HV transistor to process a higher external power supply voltage. Since these two devices operate with different voltages, gate dielectric layers of different thicknesses are made to accommodate their different voltage needs. In particular, the HV transistor needs a thicker gate dielectric layer for accepting a higher voltage, while the LV transistor has a thinner gate dielectric layer. Besides EPROM, ULSI development in the future may produce several different voltages to be applied to the same chip. Thus, according to the oxide reliability, gate dielectric layers having different thicknesses are needed in response to different voltages.

FIGS. 1A to 1D are schematic, cross-sectional diagrams illustrating a conventional method for fabricating a gate structure having gate dielectric layers having different thicknesses.

Referring to FIG. 1A, an oxide layer 108 is formed on a substrate 100 of a flash memory region 102, a HV region 104, and a LV region 106. A polysilicon layer (not shown) is formed on the oxide layer 108 and defined so that a floating gate 110 of the flash memory is formed only on the substrate 100 of the flash memory region 102. An oxide-nitride oxide (ONO) layer (not shown) is formed on the substrate 100, followed by forming a patterned photoresist (not shown) on the ONO layer. The ONO layer is defined to form an ONO dielectric layer 112 which covers the floating gate 110 on the substrate 100 of the flash memory region 102. The oxide layer 108 on the substrate of the HV region 104 and the LV region 106 is then removed, while the patterned photoresist is also removed.

Referring to FIG. 1B, an oxidation process is performed, so that an oxide layer 114 is formed on the substrate 100 of the HV region 104 and the LV region 106.

Referring to FIG. 1C, a patterned photoresist (not shown) is formed to cover the oxide layer 114 in the HV region 106 and the ONO dielectric layer 112 in the flash memory region 102, while the oxide layer 114 in the LV region 106 is left exposed. With the patterned photoresist serving as an etching mask, the oxide layer 114 in the LV region 106 is removed until the surface of the substrate 100 in the LV region 106 is exposed. The patterned photoresist is removed to expose the oxide layer 114 in the HV region 104. An oxidation process is further performed to form an oxide layer 118 on the oxide layer 114 in the HV region 104 and the substrate 100 in the LV region 106. To simplify the description, the oxide layers 114 and 118 in the HV region are generally known as an oxide layer 116.

Referring to FIG. 1D, a polysilicon layer (not shown) is formed on the substrate 100. The polysilicon layer, the oxide layer 116 in the HV region 104, and the oxide layer 118 in the LV region 106 are patterned so as to form a control gate 120a on the ONO dielectric layer 112 of the flash memory region 102. Meanwhile, a HV gate structure 122a having a gate electrode 120b and a gate oxide layer 116a is formed in the HV region 104, and a LV gate structure 122b having a gate electrode 120c and a gate oxide layer 118b is formed in the LV region 106.

Conventionally, during the formation of the gate dielectric layers having different thicknesses, steps for forming and removing the patterned photoresist have to be repeated several times on the ONO dielectric layer and the oxide layers 108, 114, in order to obtain gate dielectric layers having different thicknesses. However, as these steps are repeated several times before formation of the control gate 120a, the gate electrodes 120b, 120c, the ONO dielectric layer 112 and the oxide layers 108, 114 are contaminated by the patterned photoresists. This has made it difficult to control the quality of the ONO dielectric layer 112 and the oxide layers 108, 114. The gate oxide layer 116a, in particular suffers from poor quality after several episodes of contamination by patterned photoresist. Thus, the gate dielectric layer of the device is unable to withstand a breakdown produced by the set voltage, leading to a reduction in the reliability of the gate dielectric layer. Furthermore, the control gate 120a is damaged by etching and oxygen diffusion in the subsequent photolithographic etching and thermal oxidation.

SUMMARY OF THE INVENTION

The invention provides a method for fabricating a gate structure having gate dielectric layers of different thicknesses. The method includes providing a substrate with a flash memory region a high voltage (HV) region, and a low voltage (LV) region. A dielectric layer is then formed on the substrate. A floating gate is formed on the first dielectric layer in the flash memory region, followed by forming in sequence a second dielectric layer, a first conducting layer, and a first protective layer on the first dielectric layer and the floating gate. The first protective layer, the first conducting layer, the second dielectric layer, and the first dielectric layer are partially removed until a substrate surface in the HV region and LV region is exposed. A third dielectric layer is then formed on the substrate in the HV and LV regions. The second protective layer, the second conducting layer, and the third dielectric layer are partially removed until the substrate surface in the LV region and the first protective layer of the flash memory region are exposed. A fourth dielectric layer is formed on the substrate in the LV region, followed by forming in sequence a third conducting layer and a third protective layer. Consequently, the second and the third protective layers, the second and the third conducting layers, and the third and the fourth dielectric layers are defined to form a HV structure in the HV region and a LV structure in the LV region. The first, the second, and the third protective layers in this case include silicon nitride or silicon oxynitride.

As embodied and broadly described herein, the first, the second, and the third conducting layers as well as the first, the second, and the third protective layers are respectively formed after the formation of the second, the third, and the fourth dielectric layers. As the dielectric layer and the photoresist involved in the photolithographic etching are effectively isolated from each other, the contamination of the dielectric layer by the photoresist is greatly reduced. Also, the dielectric layer is formed by performing oxidation once, so the dielectric layer formed as such has different compositions from that of the dielectric layer formed by double oxidation. Thus, the quality and reliability of the dielectric layer are greatly improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

First Embodiment

FIGS. 2A to 2E are schematic diagrams illustrating the process flow for fabricating a gate structure having gate dielectric layers of different thicknesses according to one preferred embodiment of this invention.

Figure 1A:
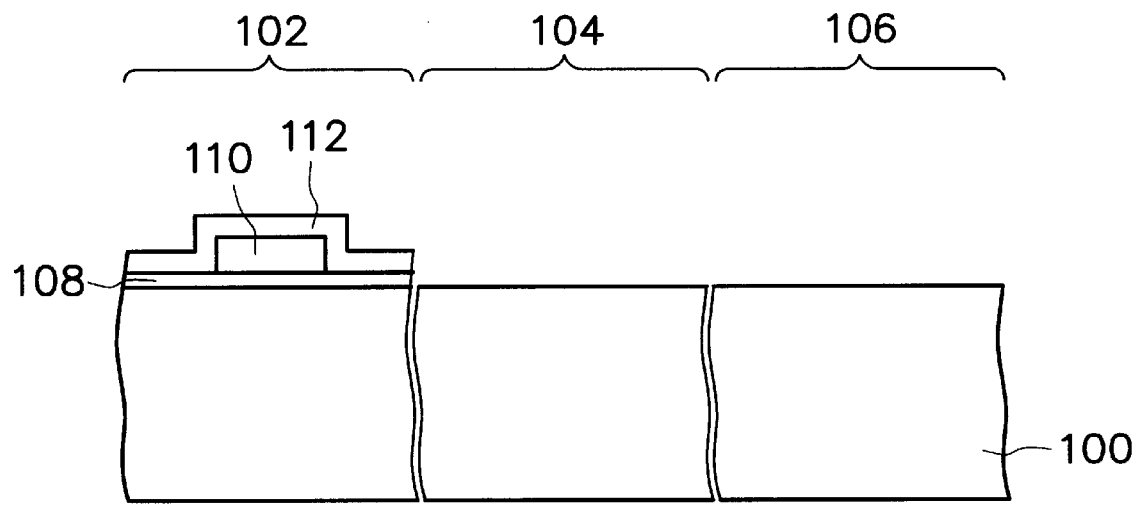
FIGS. 1A to 1D are schematic, cross-sectional diagrams illustrating the conventional process flow for fabricating a gate structure having gate dielectric layers of different thicknesses.
Figure 1B:
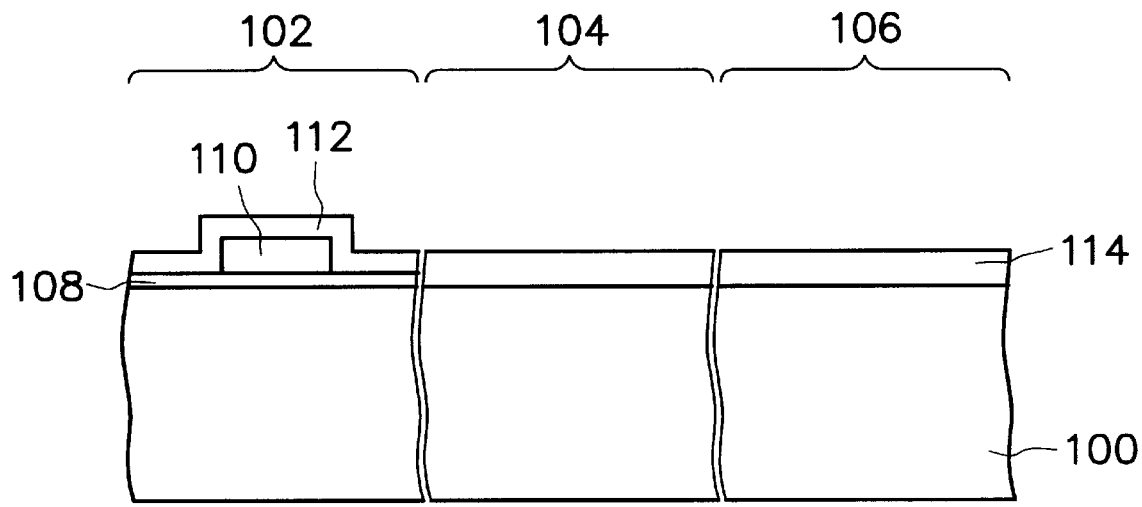
Figure 1C:
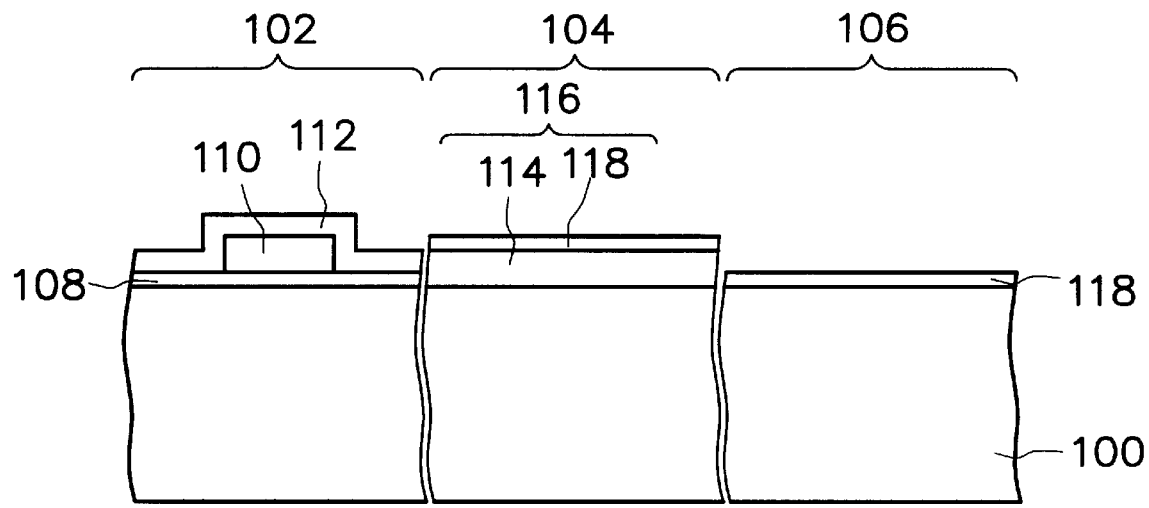
Figure 1D:
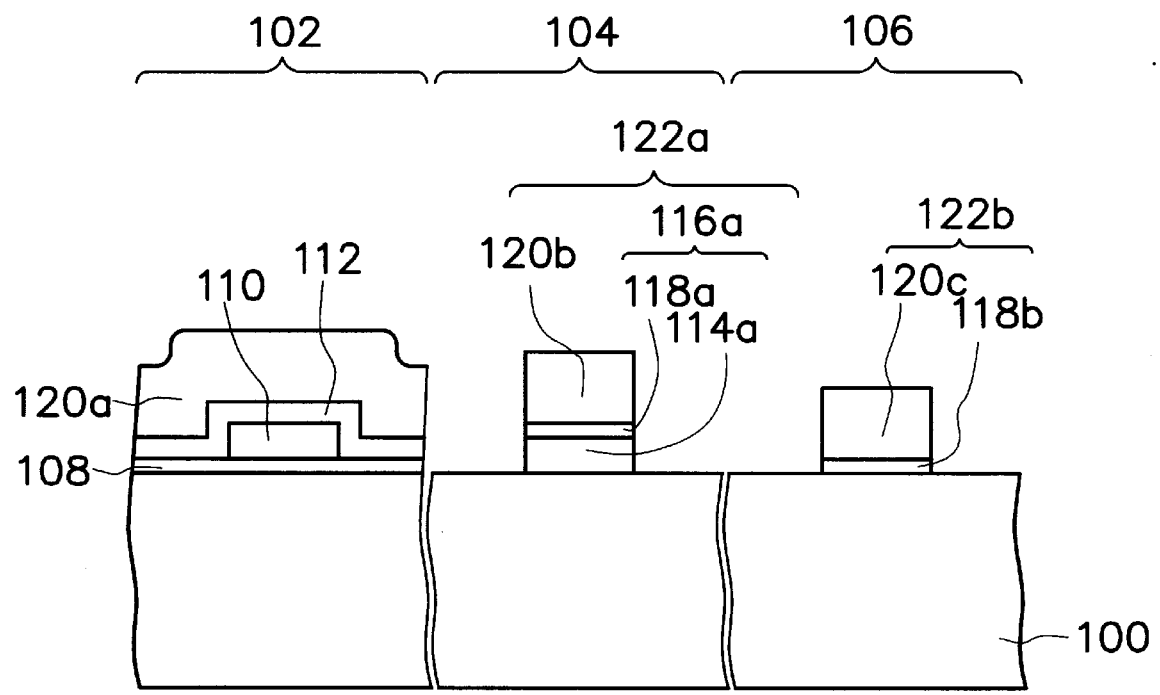
Figure 2A:
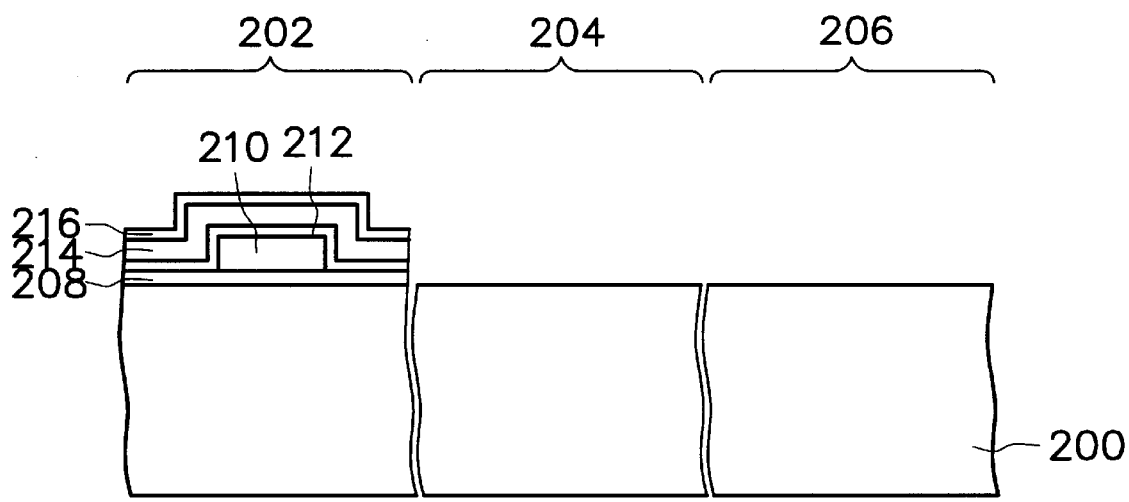
FIGS. 2A to 2E are schematic, cross-sectional diagrams illustrating the process flow for fabricating a gate structure having gate dielectric layers of different thicknesses according to one preferred embodiment of this invention.

Referring to FIG. 2A, a substrate 200 is provided, wherein the substrate 200 is divided into a flash memory region 202, a high voltage (HV) region 204, and a low voltage (LV) region 206, with respect to the characteristics of the subsequently formed devices. An oxide layer 208 is then formed on the substrate 200. A patterned conducting layer 210, which is a floating gate of the flash memory, is formed on the oxide layer 208 in the flash memory region 202. A dielectric layer (not shown), a conducting layer (not shown), and a protective layer (not shown) are formed in sequence on the floating gate 210 and the oxide layer 208. A patterned photoresist (not shown) is formed on the protective layer, while the HV region 204 and the LV region 206 remain exposed. With the patterned photoresist serving as an etching mask, the protective layer, the conducting layer, and the dielectric layer, which are located in the HV and LV regions, are removed until the surface of the substrate 200 in the HV and LV regions is exposed. As a result, a tunneling oxide layer 208, a dielectric layer 212, a control gate 214 and a protective layer 216 are formed in the flash memory region 202. The floating gate 210 and the control gate 214 in this case may include polysilicon, whereas the protective layer 216 may include a silicon nitride layer or a silicon oxy-nitride layer formed by chemical vapor deposition (CVD). However, the dielectric layer 212 may include an oxide-nitride oxide (ONO) layer formed by CVD. Furthermore, the protective layer 216 has a greater etching rate than the control gate 214. Since the conducting layer 214 and the protective layer 216 are formed after the formation of the dielectric layer 212, the repeated steps for forming and removing the photoresist on the ONO dielectric layer as used in the prior art are avoided. Thus, the ONO dielectric layer is protected from contamination with the patterned photoresist. In addition, the protective layer 216 protects the control gate 214 from being damaged by etching and oxygen diffusion in the subsequent photolithographic etching and thermal oxidation. The protective layer 216 also acts as an anti-reflection coating (ARC) layer to enhance the effect of photolithographic etching.

Figure 2B:
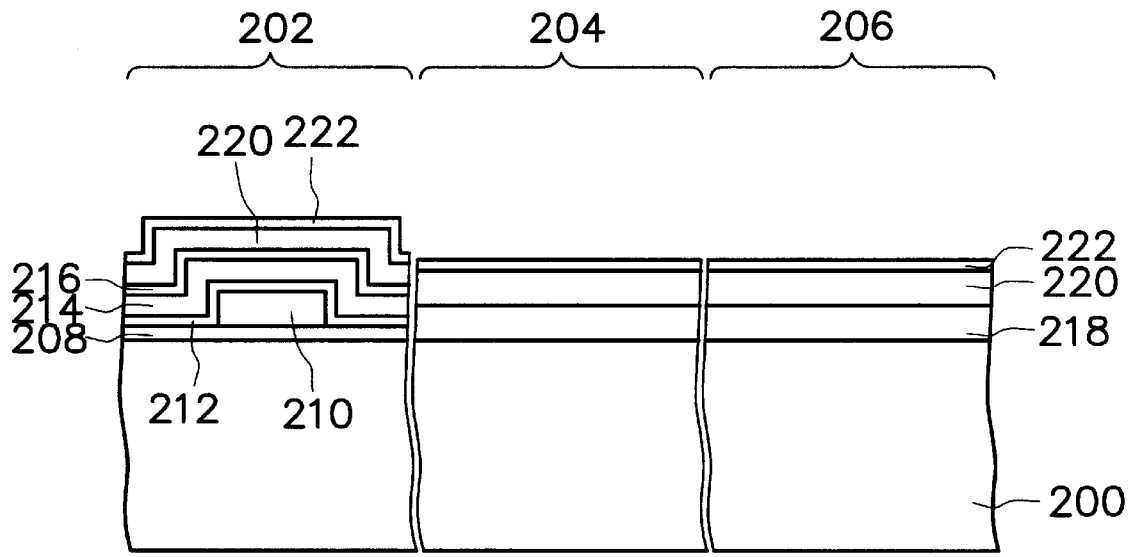

Referring to FIG. 2B, a thicker dielectric layer 218 is formed on the substrate 200 exposed in the HV region 204 and the LV region 206. The dielectric layer 218 is formed, in this case, by thermal oxidation and the thickness of the dielectric layer 218 is variable depending on the applied voltage during the operation of the HV device. A conducting layer 220 and a protective layer 222 are formed in sequence on the protective layer 216 and the dielectric layer 218. The conducting layer 220 in this case may include polysilicon, whereas the protective layer 222 may include a silicon nitride layer or a silicon oxy-nitride layer formed by CVD. The protective layer 222 has a greater etching rate than the conducting layer 220, while the protective layer 222 serves the same function as the protective layer 216.

Figure 2C:
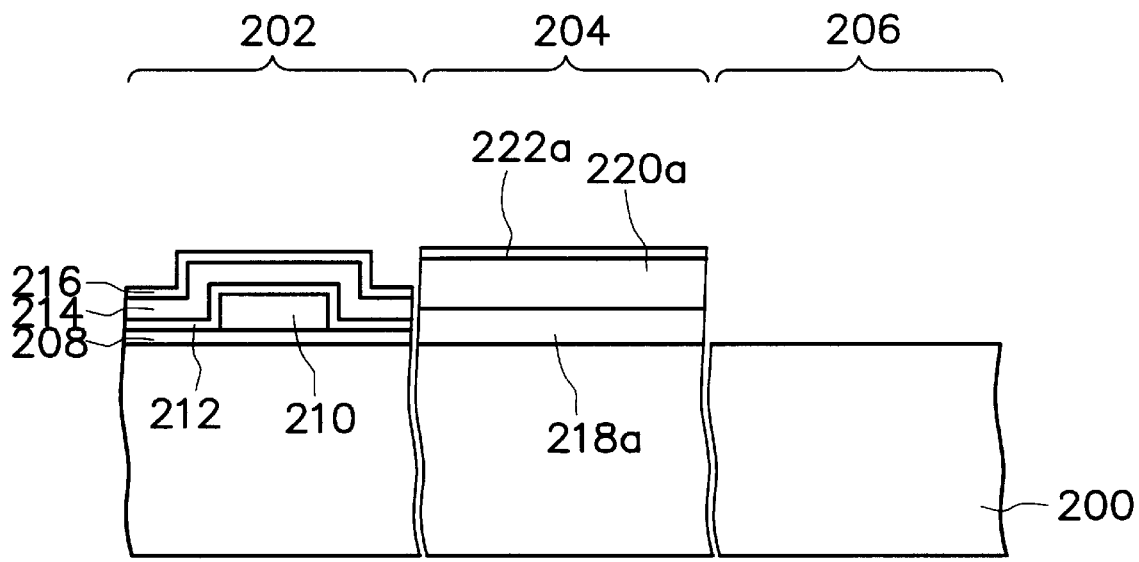

Referring to FIG. 2C, the protective layer 222, the conducting layer 220, and the dielectric layer 218 are partially removed. This allows the formation of the dielectric layer 218a, the conducting layer 220a, and the protective layer 222a in the HV region 204, while the surface of the substrate 200 in the LV region 206 and the protective layer 216 of the flash memory region 202 are exposed. The method for removing the protective layer 222 and the conducting layer 220 in this case may include reactive ion etching (RIE). Since the conducting layer 220 and the protective layer 222 are formed after formation of the dielectric layer 218, the repeated steps for forming and removing the photoresist on the dielectric layer as used in the prior art are avoided. Thus, the dielectric layer is protected from contamination with the patterned photoresist.

Figure 2D:
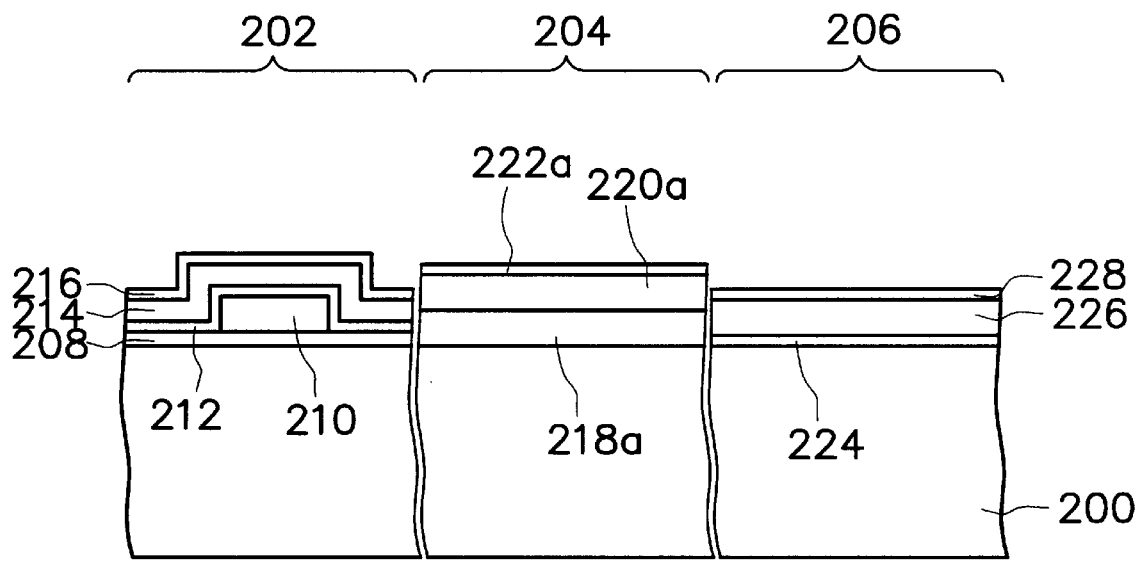

Referring to FIG. 2D, a thinner dielectric layer 224 is formed on the substrate 200 exposed in the LV region 206. The dielectric layer 224 may include an oxide layer formed by thermal oxidation, while the thickness of the dielectric layer 224 is variable depending on the applied voltage during the operation of the LV device. A conducting layer (not shown) and a protective layer (not shown) are further formed in sequence on the protective layers 216, 222a and the dielectric layer 224. Both the protective layer and the conducting layer in the HV region 204 and the flash memory region 202 are removed. As a result, a conducting layer 226 and a protective layer 228 are formed, while the protective layer 216 in the flash memory region 202 and the protective layer 222a in the HV region 204 are exposed. The method for removing the protective layer and the conducting layer in the HV region 204 and the flash memory region 202 may include RIE. The conducting layer 226 may include polysilicon, whereas the protective layer 228 may include a silicon nitride layer or a silicon oxy-nitride layer. The protective layer 228 has a greater etching rate than the conducting layer 226, while the protective layer 228 serves the same function as the protective layer 216.

Figure 2E:
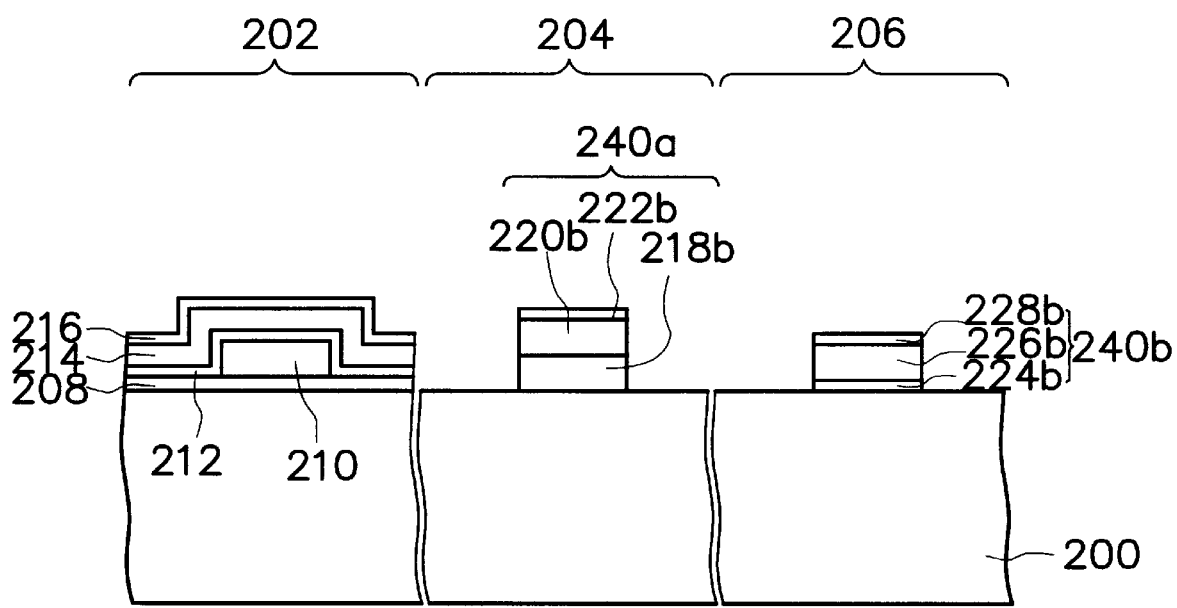

Referring to FIG. 2E, a photolithographic process is performed, so that a HV gate structure 240a having a protective layer 222b, a gate electrode 220b, and a dielectric layer 218b is formed in the HV region 204. Simultaneously, a LV gate structure 240b having a protective layer 228b, a gate electrode 226b, and a dielectric layer 224b is formed in the LV region 206. Therefore, a gate structure having different thicknesses of gate oxide layers is completed.

According to the first embodiment, the conducting layers 214, 220, 226 and the protective layers 216, 222, 228 are formed respectively on the dielectric layers 212, 218, 224 after the formation of the dielectric layers 212, 218, 224. The repeated steps for forming and removing the photoresist on the dielectric layer as used in the prior art are therefore avoided, while the dielectric layer is protected from contamination with the patterned photoresist. Thus, the quality and the reliability of the dielectric layer are improved.

Second Embodiment

FIGS. 3A to 3D are schematic diagrams illustrating the process flow for fabricating a gate structure having gate dielectric layers of different thicknesses according to another preferred embodiment of this invention.

Figure 3A:
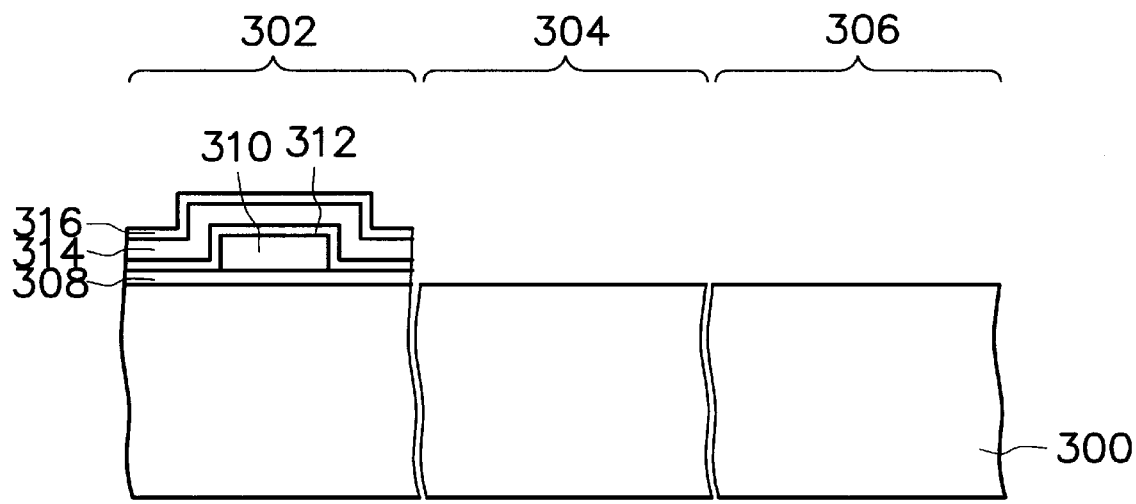
FIGS. 3A to 3D are schematic, cross-sectional diagrams illustrating the process flow for fabricating a gate structure having gate dielectric layers of different thicknesses according to another preferred embodiment of this invention.

Referring to FIG. 3A, a substrate 300 is provided, wherein the substrate 300 is divided into a flash memory region 302, a HV region 304, and a LV region 306 with respect to the characteristics of the subsequently formed devices. An oxide layer 308 is then formed on the substrate 300. A patterned conducting layer 310, which is a floating gate of the flash memory, is formed on the oxide layer 308 in the flash memory region 302. A dielectric layer (not shown), a conducting layer (not shown), and a protective layer (not shown) are formed in sequence on the floating gate 310 and the oxide layer 308. A patterned photoresist (not shown) is formed on the protective layer, while the HV region 304 and the LV region 306 remain exposed. With the patterned photoresist serving as an etching mask, the protective layer, the conducting layer, and the dielectric layer, which are located in the HV and LV regions, are removed until the surface of the substrate 300 on the HV and LV regions is exposed. As a result, a tunneling oxide layer 308, a dielectric layer 312, a control gate 314 and a protective layer 316 are formed in the flash memory region 302. The floating gate 310 and the control gate 314 in this case may include polysilicon, whereas the protective layer 316 may include a silicon nitride layer or a silicon oxy-nitride layer formed by CVD. However, the dielectric layer 312 may include an ONO layer formed by CVD. Furthermore, the protective layer 316 has a greater etching rate than the control gate 314. Since the conducting layer 314 and the protective layer 316 are formed after the formation of the dielectric layer 312, the repeated steps for forming and removing the photoresist on the ONO dielectric layer as used in the prior art are avoided. Thus, the ONO dielectric layer is protected from contamination by the patterned photoresist. In addition, the protective layer 316 protects the control gate 314 from being damaged by etching and oxygen diffusion in the subsequent photolithographic etching and thermal oxidation. The protective layer 316 also acts as an anti-reflection coating (ARC) layer to improve the effect of photolithographic etching.

Figure 3B:
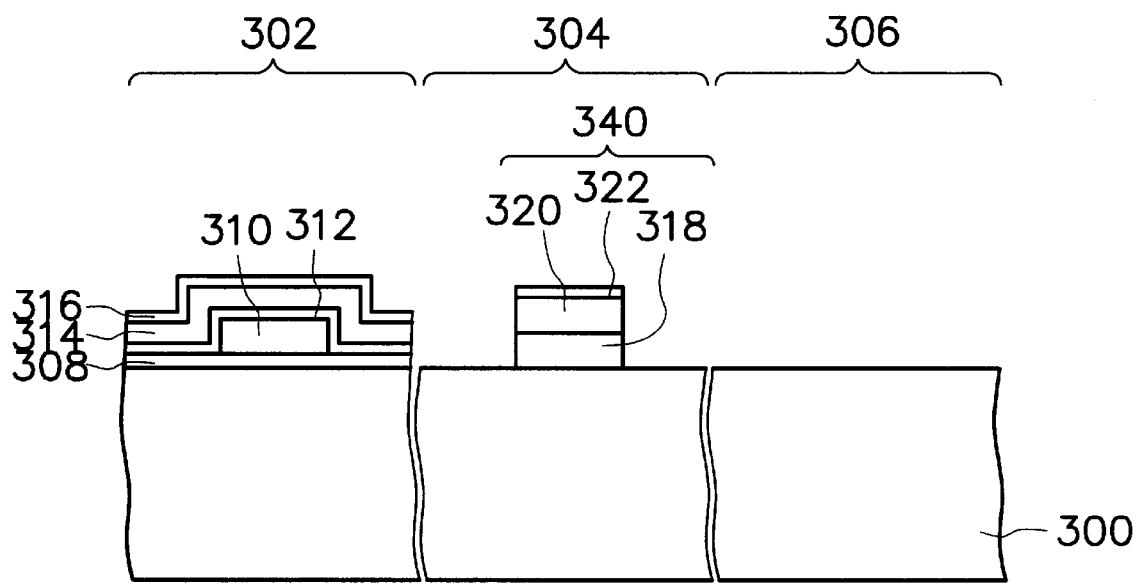

Referring to FIG. 3B, a HV gate structure 340 having a dielectric layer 318, a gate electrode 320, and a protective layer 322 is formed on the substrate 300 in the HV region 304. The formation of the HV gate structure 340 involves forming a thicker dielectric layer (not shown) on the substrate 300 exposed in the HV region 304 and the LV region 306. A conducting layer (not shown) and a protective layer (not shown) are formed in sequence on the protective layer 316 and the dielectric layer. A photolithographic process is performed to remove the conducting layer 320 and the protective layer 322 located in the flash memory region 302, as well as the protective layer 322, the conducting layer 320, and the dielectric layer 318 located in the LV region 306. As a result, a HV gate structure 340 is formed in the HV region 304. The dielectric layer 318 may include an oxide layer formed by thermal oxidation, and the thickness of the dielectric layer 318 may be variable depending on the voltage applied. The gate electrode 320 may include polysilicon, whereas the protective layer 322 may include a silicon nitride layer or a silicon oxy-nitride layer. The protective layer 322 has a greater etching rate than the gate electrode 320, while the protective layer 322 serves the same function as the protective layer 316. Since the conducting layer (not shown) and the protective layer (not shown) are formed on the dielectric layer after the formation of the dielectric layer (not shown), the repeated steps for forming and removing the photoresist on the dielectric layer as used in the prior art are avoided. Thus, the dielectric layer is protected from contamination by the patterned photoresist.

Figure 3C:
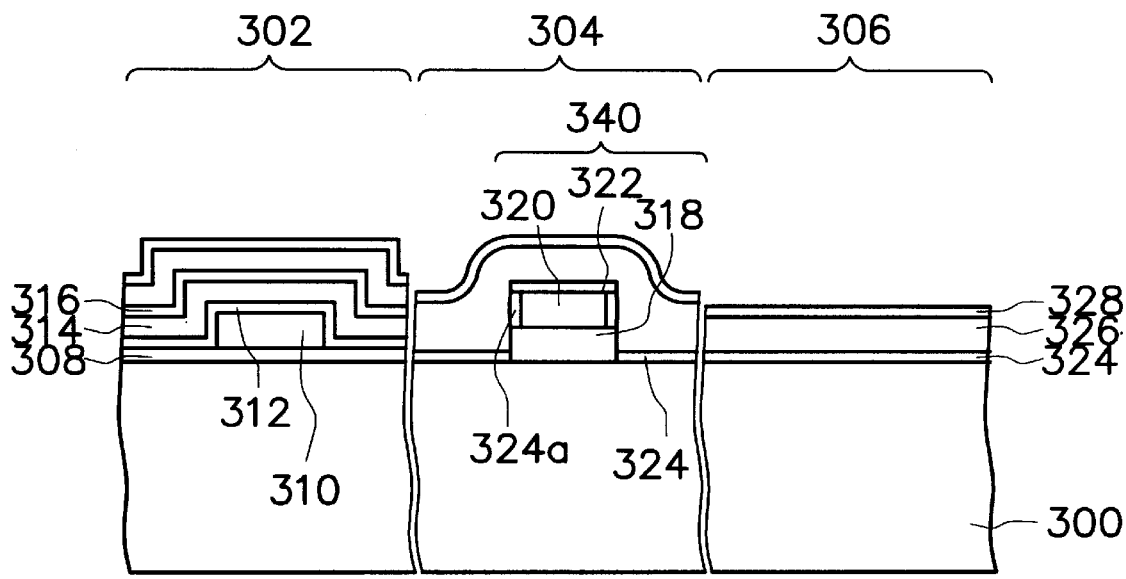

Referring to FIG. 3C, an oxidation is performed to form a thinner dielectric layer 324 on the exposed surface of the substrate 300 in the HV region 304 and the LV region 306, while a thin dielectric layer 324a is formed on a sidewall of the gate electrode 320. A conducting layer 326 and a protective layer 328 are then formed in sequence on the substrate 300. The dielectric layer 324 may include an oxide layer formed by thermal oxidation, and the thickness of the dielectric layer is variable depending on the voltage applied during the operation of the LV device. The conducting layer 326 may include polysilicon, whereas the protective layer 328 may include a silicon nitride layer or a silicon oxy-nitride layer. The protective layer 328 has a greater etching rate than the conducting layer 326, while the protective layer 328 serves the same function as that of the protective layer 316.

Figure 3D:
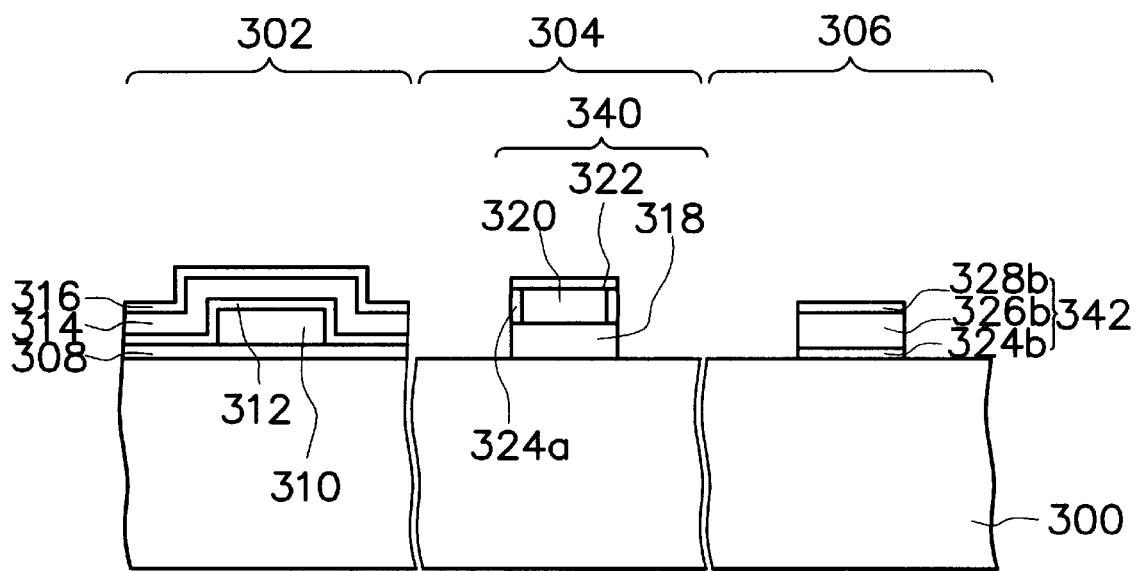

Referring to FIG. 3D, the protective layer 328 and the conducting layer 326 located in the flash memory region 302 as well as the protective layer 328, the conducting layer 326, and the dielectric layer 324 in the HV region 304 are removed. As a result, a LV gate structure 342 having a dielectric layer 324b, a gate electrode 326b, and a protective layer 328b is formed in the LV region 306. The protective layer 328, conducting layer 326, and the dielectric layer 324 in this case are partially removed by RIE.

According to the second embodiment, the conducting layers 314, 320, 326 and the protective layers 316, 322, 328 are formed respectively on the dielectric layers 312, 318, 324 after the formation of the dielectric layers 312, 318, 324. The repeated steps for forming and removing the photoresist on the dielectric layer as used in the prior art are therefore avoided, while the dielectric layer is protected from contamination by the patterned photoresist.

Summarizing the above, the present invention involves forming in sequence the conducting layer and the protective layer after the formation of the dielectric layer, so that the dielectric layer and the photoresist involved in the photolithographic etching are effectively isolated from each other. Since formation of the dielectric layer in the HV region involves only one thermal oxidation instead of several steps, the contamination of the dielectric layer by the photoresist is greatly reduced. This improves the quality and reliability of the dielectric layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a gate structure having gate dielectric layers of different thicknesses, the method comprising:

provididing a substrate which is divided into a flash memory region, a high voltage (HV) region, and a low voltage (LV) region;

forming a first dielectric layer on the substrate;

forming a floating gate on the first dielectric layer in the flash memory region;

forming in sequence a second dielectric layer, a first conducting layer, and a first protective layer on the first dielectric layer and the floating gate;

partially removing the first protective layer, the first conducting layer, the second dielectric layer, and the first dielectric layer until a surface of the substrate in the HV region and the LV region is exposed;

forming a third dielectric layer on the substrate in the HV region and the LV region;

forming in sequence a second conducting layer and a second protective layer on the substrate after the third dielectric layer is formed;

partially removing the second protective layer, the second conducting layer, and the third dielectric layer until the surface of the substrate in the LV region and the first protective layer in the flash memory region are exposed;

forming a fourth dielectric layer on the substrate in the LV region;

forming in sequence a third conducting layer and a third protective layer on the substrate;

defining the second and the third protective layers, the second and the third conducting layers, and the third and the fourth dielectric layers to form a HV gate structure in the HV region and a LV gate structure in the LV region.

2. The fabrication method of claim 1, wherein the first, second, and the third protective layers include silicon nitride.

3. The fabrication method of claim 1, wherein the first, second, and the third protective layers include silicon oxy-nitride.

4. The fabrication method of claim 1, wherein the first protective layer has a greater etching rate than the first conducting layer.

5. The fabrication method of claim 1, wherein the second protective layer has a greater etching rate than the second conducting layer.

6. The fabrication method of claim 1, wherein the third protective layer has a greater etching rate than the third conducting layer.

7. The fabrication method of claim 1, wherein the second dielectric layer includes oxide-nitride-oxide (ONO).

8. A method for fabricating a gate structure which has gate dielectric layers of different thicknesses, the method comprising:

providing a substrate which is divided a flash memory region, a HV region, and a LV region;

forming a first dielectric layer on the substrate;

forming a floating gate on the first dielectric layer in the flash memory region;

forming in sequence a second dielectric layer, a first conducting layer, and a first protective layer on the first dielectric layer and the floating gate;

defining the first protective layer, the first conducting layer, the second dielectric layer, and the first dielectric layer until a surface of the substrate in the HV region and the LV region is exposed;

forming a third dielectric layer on the substrate in the HV region and the LV region;

forming in sequence a second conducting layer and a second protective layer on the substrate after the third dielectric layer is formed;

defining the second protective layer, the second conducting layer, and the third dielectric layer, so that a HV gate structure is formed on the substrate in the HV region;

forming a fourth dielectric layer on the substrate exposed by the HV gate structure;

forming in sequence a third conducting layer and a third protective layer on the substrate;

defining the third protective layer, the third conducting layer, and the fourth dielectric layer to form a LV gate structure in the LV region.

9. The fabrication method of claim 8, wherein the first, the second, and the third protective layers include silicon nitride.

10. The fabrication method of claim 8, wherein the first, the second, and the third protective layers include silicon oxy-nitride.

11. The fabrication method of claim 8, wherein the first protective layer has a greater etching rate than the first conducting layer.

12. The fabrication method of claim 8, wherein the second protective layer has a greater etching rate than the second conducting layer.

13. The fabrication method of claim 8, wherein the third protective layer has a greater etching rate than the third conducting layer.

* * * * *